United States Patent
Dai et al.

(10) Patent No.: US 8,642,121 B2
(45) Date of Patent: Feb. 4, 2014

(54) THERMAL INTERFACE MATERIAL HAVING A PATTERNED CARBON NANOTUBE ARRAY AND METHOD FOR MAKING THE SAME

(75) Inventors: Feng-Wei Dai, Beijing (CN); Yuan Yao, Beijing (CN); You-Sen Wang, Beijing (CN); Ji-Cun Wang, Beijing (CN); Hui-Ling Zhang, Beijing (CN)

(73) Assignees: Tsinghua University, Beijing (CN); Hon Hai Precision Industry Co., Ltd., New Taipei (TW)

( * ) Notice: Subject to any disclaimer, the term of this patent is extended or adjusted under 35 U.S.C. 154(b) by 1074 days.

(21) Appl. No.: 12/587,637

(22) Filed: Oct. 8, 2009

(65) Prior Publication Data
US 2010/0301260 A1 Dec. 2, 2010

(30) Foreign Application Priority Data
May 27, 2009 (CN) .......................... 2009 1 0107740

(51) Int. Cl.
*B05D 3/00* (2006.01)
*H01B 1/04* (2006.01)

(52) U.S. Cl.
USPC ........... 427/190; 427/189; 977/742; 977/778; 977/789; 252/503

(58) Field of Classification Search
USPC ......... 428/642, 402, 114, 539.5; 252/71, 503; 427/255, 395, 189, 190, 191; 977/742, 977/778, 789
See application file for complete search history.

(56) References Cited

U.S. PATENT DOCUMENTS

| | | | |
|---|---|---|---|
| 6,939,525 B2 * | 9/2005 | Colbert et al. | 423/447.1 |
| 7,205,069 B2 * | 4/2007 | Smalley et al. | 429/129 |
| 7,311,967 B2 * | 12/2007 | Dani et al. | 428/323 |
| 7,510,695 B2 * | 3/2009 | Smalley et al. | 423/447.3 |
| 7,662,732 B2 * | 2/2010 | Choi et al. | 438/800 |
| 8,129,001 B2 * | 3/2012 | Wang et al. | 427/532 |

(Continued)

FOREIGN PATENT DOCUMENTS

| | | |
|---|---|---|
| JP | 2008-251963 | 10/2008 |
| TW | 200700314 | 1/2007 |
| TW | 200840878 | 10/2008 |
| TW | 200906710 | 2/2009 |

OTHER PUBLICATIONS

Helical Microtubules of Graphitic Carbon, Nature, vol. 354, Nov. 7, 1991, pp. 56-58.

(Continued)

*Primary Examiner* — Peter F Godenschwager
*Assistant Examiner* — Jane L Stanley
(74) *Attorney, Agent, or Firm* — Altis Law Group, Inc.

(57) ABSTRACT

A method for making a thermal interface material includes following steps. A substrate having a plurality of CNT arrays arranged thereon and a number of first interspaces defined between the CNT arrays is provided. A container is provided and the substrate with the CNT arrays is disposed into the container. A number of low melting point metallic nanoparticles is provided and filled in the first interspaces. The low melting point metallic nanoparticles in the container is heated into a liquid state, and the low melting point metal nanoparticles in liquid state is combined with the CNT arrays to form a composite material on the substrate. The composite material is peeled off from the substrate, and a thermal interface material is obtained.

12 Claims, 7 Drawing Sheets

(56) References Cited

U.S. PATENT DOCUMENTS

| | | | |
|---|---|---|---|
| 2003/0077478 A1* | 4/2003 | Dani et al. | 428/673 |
| 2003/0165418 A1* | 9/2003 | Ajayan et al. | 423/447.2 |
| 2004/0245209 A1* | 12/2004 | Jung et al. | 216/8 |
| 2006/0185595 A1* | 8/2006 | Coll et al. | 118/724 |
| 2007/0273264 A1* | 11/2007 | Choi et al. | 313/311 |
| 2008/0241545 A1 | 10/2008 | Wang et al. | |
| 2008/0291634 A1* | 11/2008 | Weiser et al. | 361/708 |
| 2009/0014864 A1* | 1/2009 | Yao et al. | 257/706 |
| 2009/0032496 A1 | 2/2009 | Yao et al. | |
| 2009/0117279 A1 | 5/2009 | Liu et al. | |
| 2009/0269498 A1* | 10/2009 | Liao et al. | 427/294 |
| 2010/0172101 A1* | 7/2010 | Yao et al. | 361/704 |
| 2010/0219550 A1* | 9/2010 | Yao et al. | 264/105 |
| 2011/0038124 A1* | 2/2011 | Burnham et al. | 361/717 |
| 2011/0180968 A1* | 7/2011 | Hu et al. | 264/328.2 |

OTHER PUBLICATIONS

Unusually High Thermal Conductivity of Carbon Nanotubes, p. 4613-4615, vol. 84, Physical Review Letters 2000.

* cited by examiner

THERMAL INTERFACE MATERIAL HAVING A PATTERNED CARBON NANOTUBE ARRAY AND METHOD FOR MAKING THE SAME

BACKGROUND

1. Technical Field

The present disclosure relates to a thermal interface material and a method for fabricating the same, and particularly to a thermal interface material having a patterned carbon nanotube array and a method for fabricating the same.

2. Description of Related Art

Many electronic components such as semiconductor chips are becoming progressively smaller with each new product release, while at the same time the heat dissipation requirements of these kinds of components are increasing due to their improved ability to provide more functionality. Commonly, a thermal interface material is utilized between an electronic component and a heat sink in order to fill air spaces therebetween and thereby promote efficient heat transfer.

Carbon nanotubes (CNTs) produced by means of arc discharge between graphite rods were first discovered and reported in an article by Sumio Iijima, entitled "Helical Microtubules of Graphitic Carbon" (Nature, Vol. 354, Nov. 7, 1991, pp. 56-58). An another article authored by Savas Berber, entitled "Unusually High Thermal Conductivity of Carbon Nanotubes" (page 4613, Vol. 84, Physical Review Letters 2000) discloses that a heat conduction coefficient of a carbon nanotube can be 6600 W/mK (watts/milliKelvin) at room temperature. That tends to make CNTs ideal candidates for thermal interface material.

A method for making the thermal interface material having a CNT array is by diffusing particles with a high heat conduction coefficient therein. The particles can be made of graphite, boron nitride, silicon oxide, alumina, silver, or other metals. However, the diffusing particles can not be uniformly dispersed into the CNT array, because the interspaces therein is small, and interfaces between some diffusing particles and CNTs in the CNT array is high. Therefore, the heat conduction coefficient of the thermal interface material is low and cannot adequately meet the heat dissipation requirements of modern electronic components.

Another method for making the thermal interface material having a CNT array is by injection molding. In this method, the CNT array is filled with a polymer material. However, the thermal interface material formed by injection molding is relatively thick. This increases a bulk of the thermal interface material, reduces its flexibility. Furthermore, because of the polymer material, the heat conducting efficiency of thermal interface material is low.

Therefore, a simple method for making a thermal interface material is desired, which is thin, and has a high heat conducting efficiency.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments.

DETAILED DESCRIPTION

Figure 1A:
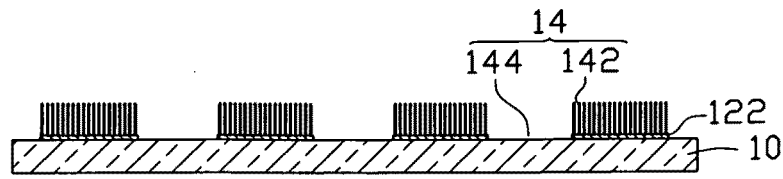
FIGS. 1A though 1E are sectional views of one embodiment of a method for making a thermal interface material.
Figure 1B:
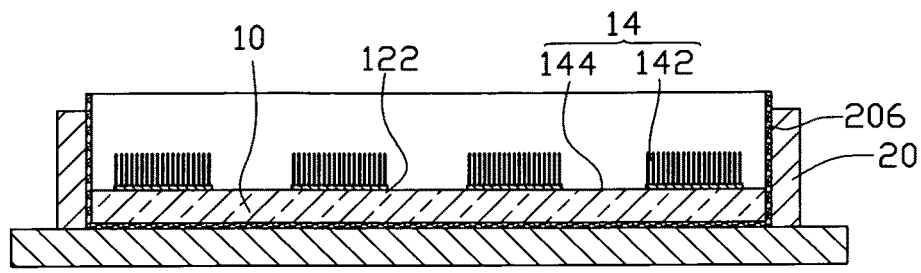
Figure 1C:
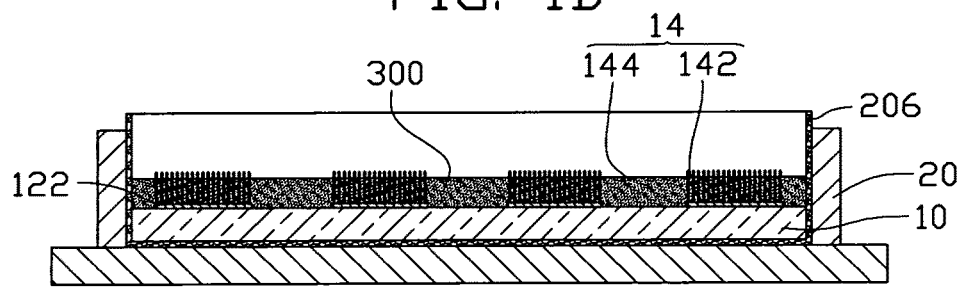
Figure 1D:
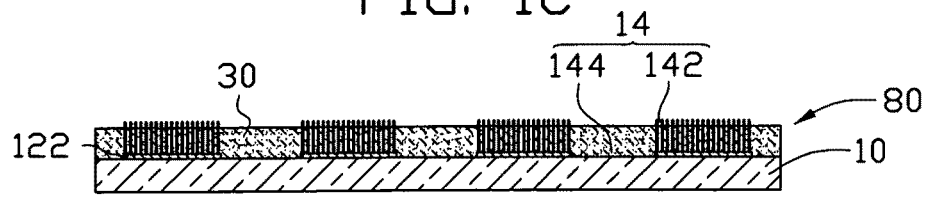
Figure 1E:
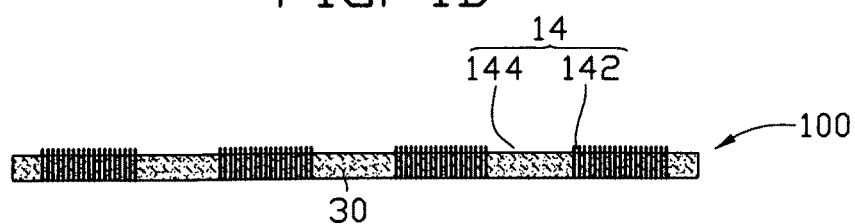

Referring to FIGS. 1A through 1E, one embodiment of a method for making a thermal interface material 100 having a patterned CNT array 14 is illustrated. The method includes the following steps:

(a) providing a patterned CNT array 14 on a substrate 10, the patterned CNT array 14 including a plurality of CNT arrays 142 and a plurality of first interspaces 144 defined between two adjacent CNT arrays 142;

(b) providing a container 20 and disposing the substrate 10 with the CNT arrays 142 into the container 20;

(c) providing a plurality of low melting point metallic nanoparticles 300 and filling the first interspaces 144 with the low melting point metallic nanoparticles 300;

(d) heating the low melting point metallic nanoparticles 300 in the container 20 to a liquid state, then combining them with the CNT arrays 142 to form a composite material 80 on the substrate 10;

(e) peeling off the composite material 80 from the substrate 10, and obtaining a thermal interface material 100.

Figure 2A:
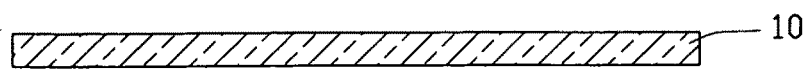
FIGS. 2A through 2C are sectional views of one embodiment of a method for making a pattered carbon nanotube array used in the method for making the thermal interface material in FIGS. 1A through 1E.
Figure 2B:
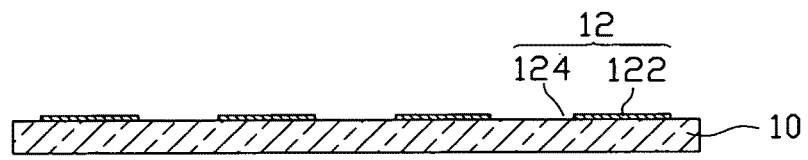
Figure 2C:
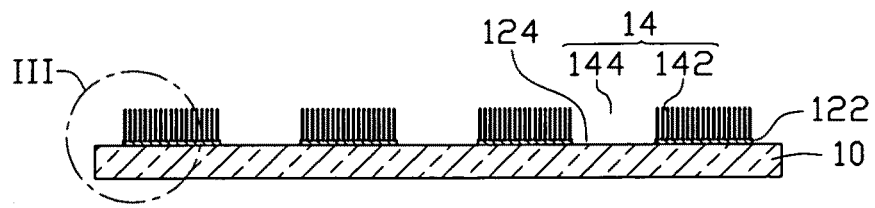

Referring to FIGS. 2A through 2C, in step (a), the patterned CNT array 14 can be formed by the substeps of:

(a1) providing a substantially flat and smooth substrate 10;

(a2) forming a patterned catalyst layer 12 on the substrate 10, wherein the patterned catalyst layer 12 includes a plurality of catalyst sections 122 with an interval 124 formed between two adjacent catalyst sections 122;

(a3) annealing the substrate 10 with the patterned catalyst layer 12 at a temperature in a range from about 700° C. to about 900° C. in air for about 30 minutes to about 90 minutes;

(a4) heating the substrate 10 with the patterned catalyst layer 12 at a temperature in the approximate range from about 500° C. to about 740° C. in a furnace with a protective gas therein; and (a5) supplying a carbon source gas in the furnace for about 5 minutes to about 30 minutes and growing the patterned CNT array 14 from the catalyst sections 122 on the substrate 10.

In step (a1), the substrate 10 can be a P-type silicon wafer, an N-type silicon wafer, or a silicon wafer with a film of silicon dioxide thereon. In one embodiment, a 4-inch P-type silicon wafer is used as the substrate 10.

In step (a2), the catalyst of the patterned catalyst layer 12 can be made of iron (Fe), cobalt (Co), nickel (Ni), or any alloy thereof. The intervals 124 correspond to the first interspaces 144. Widths of the intervals 124 are in a range from about 10 microns to about 500 microns.

In one embodiment, the whole substrate 10 is patterned with Fe films 5 nanometers (nm) thick formed by electron beam evaporation through shadow masks, containing squared openings with side lengths of about 10 to about 250 millimeters (mm) at pitch distances of about 50 mm to about 200 mm. Therefore, the patterned catalyst layer 12 including a plurality of the catalyst sections 122 and a plurality of the intervals 124, is formed on the substrate 10.

In step (a4), the protective gas can be made up of at least one of nitrogen ($N_2$), ammonia ($NH_3$), and a noble gas. In step (a5), the carbon source gas can be a hydrocarbon gas, such as ethylene ($C_2H_4$), methane ($CH_4$), acetylene ($C_2H_2$), ethane ($C_2H_6$), or any combination thereof.

In step (a5), a CNT array 142 can be grown upon each catalyst section 122, therefore the patterned CNT array 14 including a plurality of the CNT arrays 142 can be achieved on the substrate 10. The plurality of first interspaces 144 is defined between two adjacent CNT arrays 142. Widths of the first interspaces 144 are in a range from about 10 microns to about 500 microns.

Figure 3:
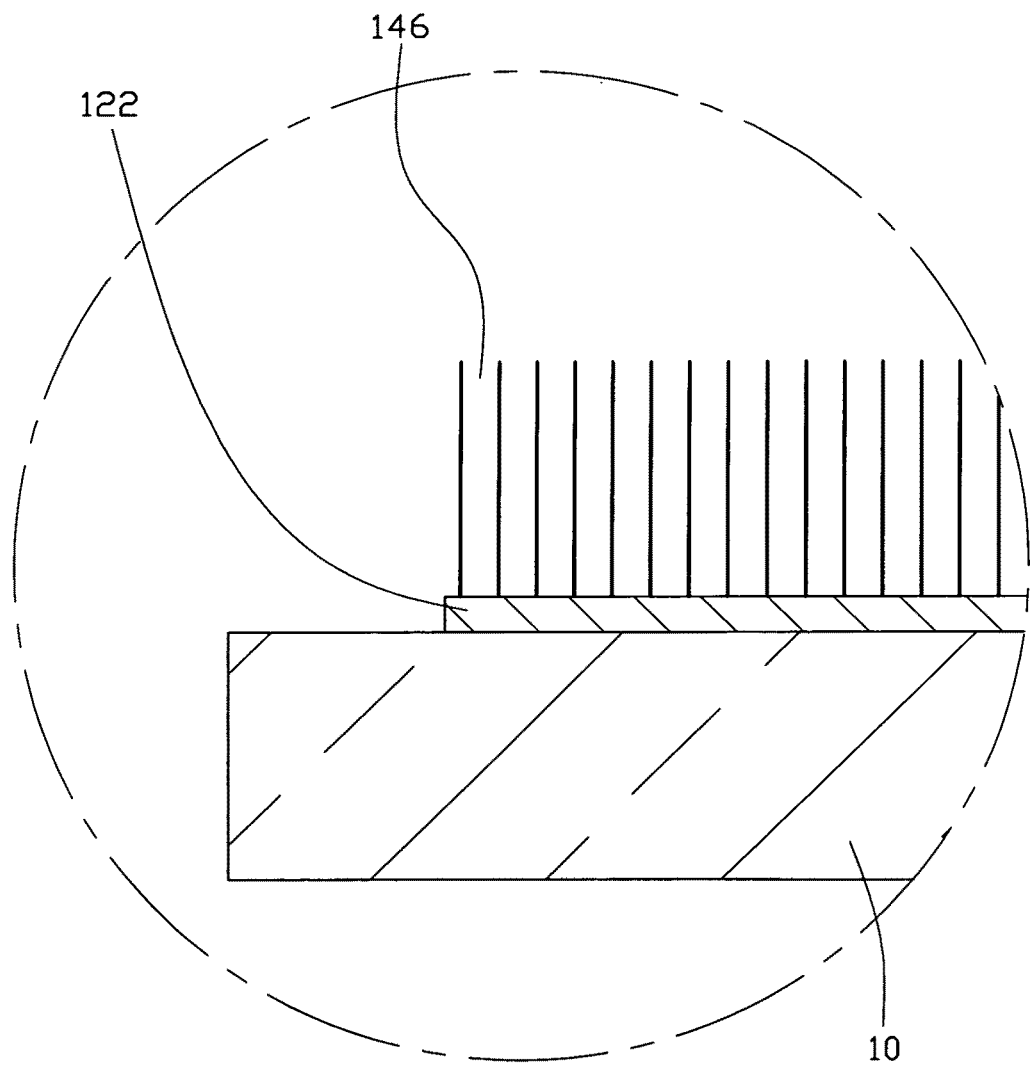
FIG. 3 is an enlarged view of part III in FIG. 2C.
Figure 4:
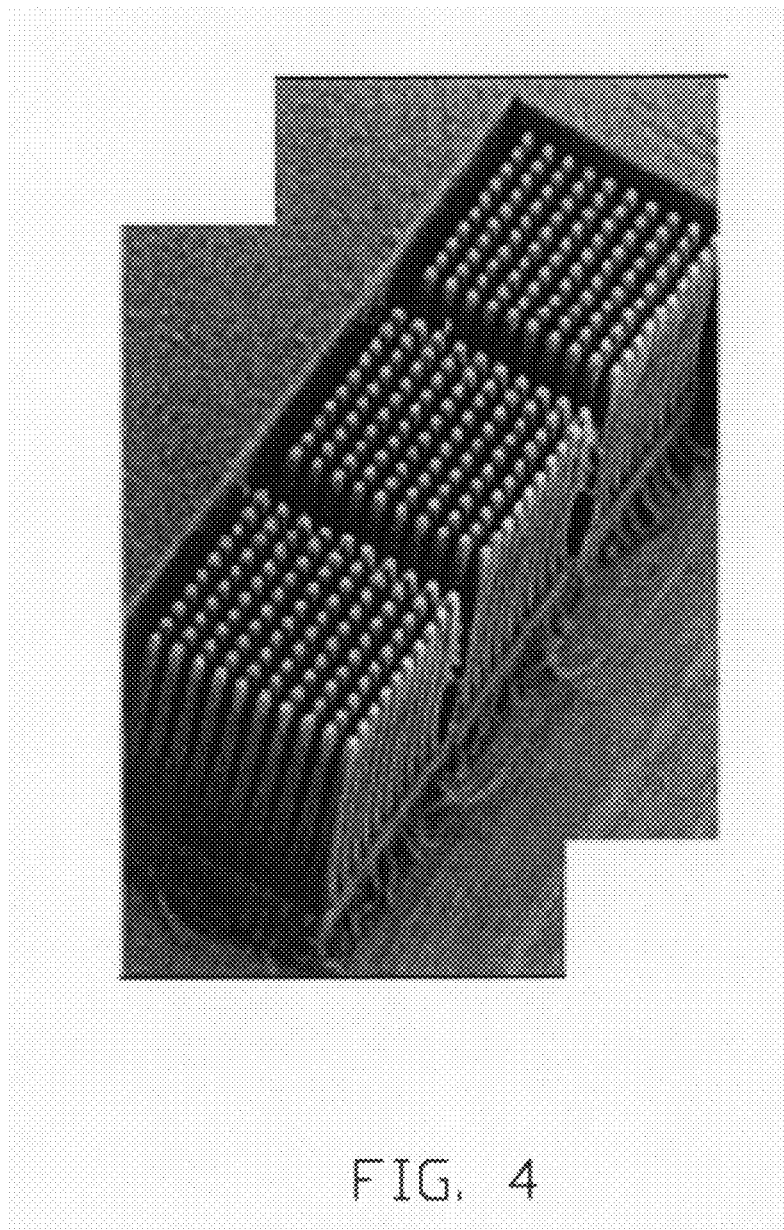
FIG. 4 shows a Scanning Electron Microscope image of the patterned carbon nanotube array in FIG. 2G.

Referring to FIG. 2C, FIG. 3 and FIG. 4, each CNT array 142 can be about 10 microns to about 1 millimeter high and include a plurality of carbon nanotubes substantially parallel to each other and substantially perpendicular to the substrate 10. The CNT arrays 142 are essentially free of impurities, such as carbonaceous or residual catalyst particles. A plurality of second interspaces 146 is defined between the adjacent carbon nanotubes in each CNT array 142. Widths of the second interspaces 146 are in a range from about 20 nm to about 500 nm.

It is to be understood that the area of the patterned CNT array 14 is in accordance with the area of the substrate 10. Thus, the area of the patterned CNT array 14 can be controlled by adjusting the area of the substrate 10.

Figure 5:
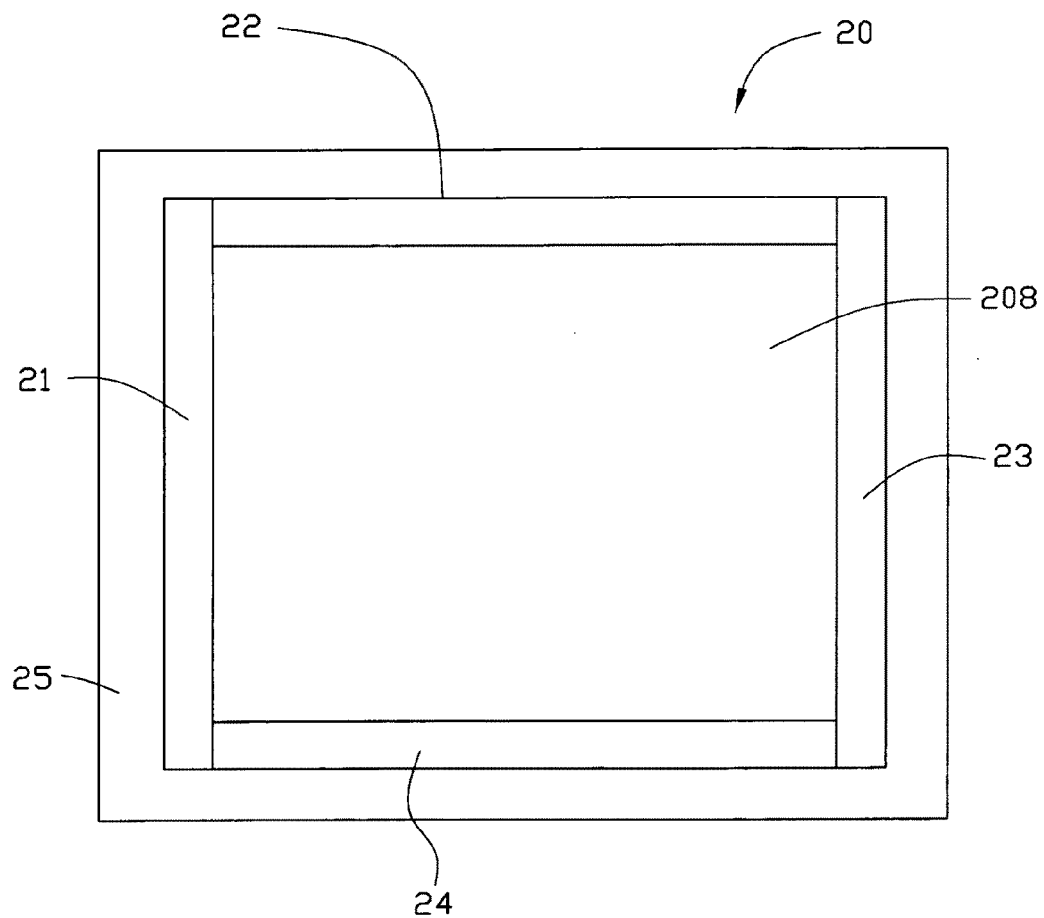
FIG. 5 is a schematic, enlarged view of one embodiment of a container used in the method of FIG. 1B.

In step (b), the container 20 can be made up of rigid materials with high melting points, such as metal or glass. Referring to FIG. 5, the container 20 includes a first board 21, a second board 22, a third board 23, a fourth board 24, and a basic board 25. The first board 21 is facing and substantially parallel to the third board 23. The second board 22 is facing and substantially parallel to the fourth board 24. The first board 21, the second board 22, the third board 23, and the fourth board 24 are substantially perpendicular to the basic board 25. The first board 21, the second board 22, the third board 23, the fourth board 24, and the basic board 25 together define a space 208.

In step (b), before disposing the substrate 10 into the container 20, a graphite paper 206 can be disposed in the space 208 of the container 20. In one embodiment, a graphite paper 206 (shown in FIG. 1B and FIG. 1C) is disposed in the space 208, then the substrate 10 with the patterned CNT array 14 is disposed on the graphite paper 206 above the basic board 25.

In step (c), the material of the low melting point metallic nanoparticles 300 can be indium (In), gallium (Ga), an alloy of antimony (Sb) and bismuth (Bi), an alloy of lead and tin, or any combination thereof. The melting point of the low melting point metallic nanoparticles 300 is below 200° C. The size of the low melting point metallic nanoparticles 300 is in a range from about 10 nanometers to about 2500 nanometers. The first interspaces 144 can be filled up to a level not above free ends of the carbon nanotubes of the CNT arrays 142 with the low melting point metallic nanoparticles 300.

Step (d) includes the following substeps of:

(d1) placing the container 20 having the CNT arrays 142 into a chamber, wherein the chamber is at 20-200° C. and filled with at least one inert gas;

(d2) increasing the temperature of the chamber at a rate of about 5° C. per minute, until the temperature of the chamber is about 150° C. to about 200° C.; and (d3) holding the temperature from about 0.2 hours to about 1.5 hours, and melting the low melting point metallic nanoparticles 300 to a liquid state;

(d4) cooling the chamber to room temperature in an environment of inert gas, holding the room temperature (about 25° C.) for a while until the low melting point metallic nanoparticles 300 in the liquid state are solidified to a solid state low melting point metal matrix 30, and combined with the patterned CNT array 14 to form the composite material 80.

In step (d3), the liquid state low melting point metal can be dispersed in the first interspaces 144 and the second interspaces 146. The low melting point metallic nanoparticles 300 in a liquid state flow into the second interspaces 146 and the first interspaces 144 simultaneously, or from the first interspaces 144 into the second interspaces 146.

In step (d4), a thickness of the solid low melting point metal matrix 30 can be controlled by adjusting the quantity of the low melting point metallic nanoparticles 300. In one embodiment, the thickness of the solid melting point metal matrix 30 can be a less than the height of the carbon nanotubes of the patterned CNT array 14. Therefore one portion of the carbon nanotubes of the patterned CNT array 14 is exposed from the composite material 80.

In step (e), the composite material 80 includes the low melting point metal matrix 30 and the patterned CNT array 14. The low melting point metal matrix 30 is dispersed in the first interspaces 144. The low point metal matrix 30 is combined with the patterned CNT array 14 to form the composite material 80. The composite material 80 can be peeled off from the substrate 10. In one embodiment, a portion of the composite material 80 is peeled off from the substrate using a knife, thereby a thermal interface material 100 is gained.

Figure 6:
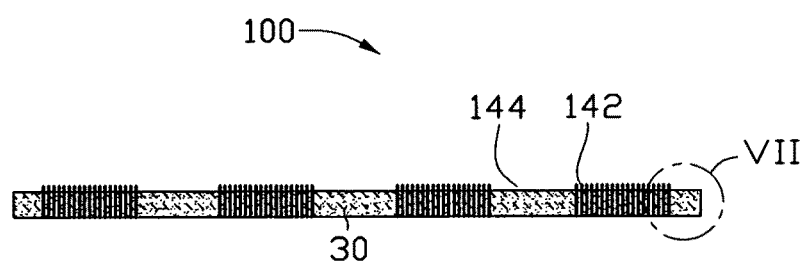
FIG. 6 is a schematic view of one embodiment of a thermal interface material having a patterned carbon nanotube array.

Referring to FIG. 6, one embodiment of a thermal interface material 100, formed by the method described above, includes a low melting point metal matrix 30 and a patterned CNT array 14. The patterned CNT array 14 includes a plurality of CNT arrays 142 and a plurality of first interspaces 144. The patterned CNT array 14 is dispersed in the low melting point metal matrix 30. The first interspaces 144 are filled with the low melting point metal matrix 30.

Each CNT array 142 includes a plurality of carbon nanotubes substantially parallel to each other and substantially perpendicular to the substrate 30. The CNT arrays 142 can have a height of about 10 microns to about 1 millimeter. The first interspaces 144 are defined between the adjacent CNT arrays 142. Widths of the first interspaces 144 are in a range from about 10 microns to about 1 millimeter.

Figure 7:
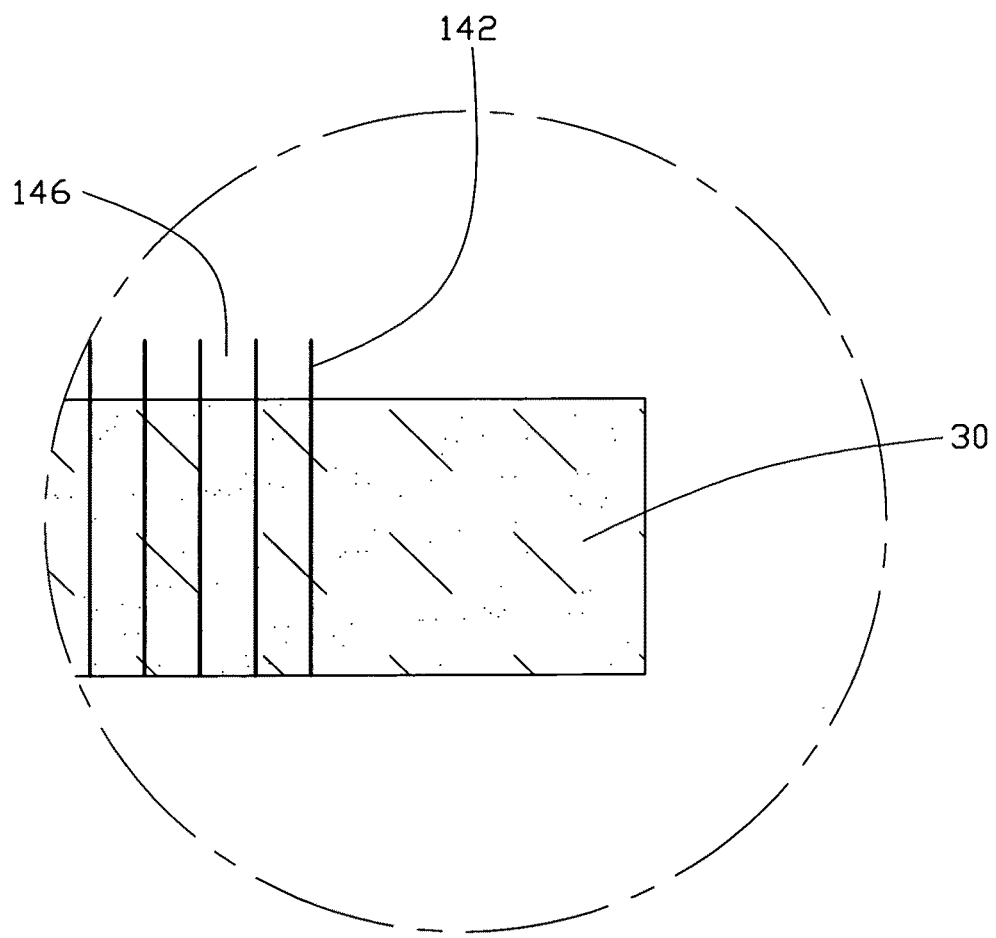
FIG. 7 is an enlarged view of part VII in FIG. 6.

Referring to FIG. 7, the second interspaces 146 are defined between adjacent carbon nanotubes in each CNT array 142. The low melting point metal matrix 30 is also filled in the second interspaces 146. Widths of the second interspaces 142 are in a range from about 20 nm to about 500 nm.

The low point metal matrix 30 can be made of indium (In), gallium (Ga), an alloy of antimony (Sb) and bismuth (Bi), an alloy of lead and tin, or any combination thereof. A thickness of the low melting point metal matrix 30 can be in a range from about 10 microns to 1 about millimeter.

It may be understood that the thickness of the low melting point metal matrix 30 can be less or greater than the height of the carbon nanotubes of the patterned CNT array 14. In one embodiment, the thickness of the low melting point metal matrix 30 is less than the height of the carbon nanotubes of the patterned CNT array 14. Therefore, ends of the carbon nanotubes are exposed out of the thermal interface material 100. This ensures that the carbon nanotubes in the thermal interface material 100 thermally contact an electronic element and a heat sink directly.

In use, the thermal interface material 100 of the present embodiment can be disposed between an electronic component and a heat spreader. When ambient temperature is above the melting point of the thermal interface material 100, the low melting point metallic matrix 30 changes to a liquid capable of filling the gaps between the electronic component and the heat spreader, and as such, reduces the thermal contact resistance therebetween. The patterned CNT array 14 includes a plurality of first interspaces 144, the low melting point metal matrix 30 is uniformly filled in the first interspaces 144, and the thermal interface material 100 has a higher thermal conductivity. Further, the method for fabricating the thermal interface material 100 is simple and can be applied in mass production at a low cost.

It is also to be understood that the above description and the claims drawn to a method may include some indication in reference to certain steps. However, the indication used is only to be viewed for identification purposes and not as a suggestion as to an order for the steps.

Finally, it is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for making a thermal interface material comprising:
   (a) fabricating a substrate comprising a plurality of carbon nanotube arrays arranged thereon, wherein each of the carbon nanotube arrays comprises a plurality of carbon nanotubes extending from the substrate, each of a plurality of first interspaces is defined between two adjacent carbon nanotube arrays, and each of a plurality of second interspaces is defined between two adjacent carbon nanotubes of the carbon nanotube array;
   (b) providing a container and disposing the substrate with the carbon nanotube arrays into the container;
   (c) providing a plurality of low melting point metallic nanoparticles and filling the low melting point metallic nanoparticles in the carbon nanotube arrays, wherein the low melting point metallic nanoparticles are filled in the first interspaces of the carbon nanotube arrays, and wherein the low melting point metallic nanoparticles are level with a top end of each of the carbon nanotube arrays;
   (d) heating the low melting point metallic nanoparticles into a liquid state, and combining the low melting point metallic nanoparticles in the liquid state with the carbon nanotube arrays to form a composite material on the substrate; and
   (e) peeling off the composite material from the substrate and obtaining a thermal interface material.

2. The method as claimed in claim 1, wherein a width of the first interspaces is in a range from about 10 microns to about 1 millimeter, a width of the second interspaces is in a range from about 20 nanometers to about 500 nanometers.

3. The method as claimed in claim 1, wherein the low melting point metallic nanoparticles are heated to a metallic liquid, the metallic liquid flows into the first interspaces and the second interspaces.

4. The method as claimed in claim 1, wherein in step (d), the metallic liquid is below the top end of each of the carbon nanotube arrays so that after the metallic liquid flows into the second interspaces of the carbon nanotubes, the top end of each of the carbon nanotube arrays is exposed.

5. The method as claimed in claim 1, wherein the low melting point metallic nanoparticles have a melting point below 200° C.

6. The method as claimed in claim 1, wherein the low melting point metallic nanoparticles are made of indium, gallium, an alloy of antimony and bismuth, an alloy of lead and tin, or any combination thereof 7. The method as claimed in claim 1, wherein the low melting point metallic nanoparticles are sized in a range from about 10 nanometers to about 2500 nanometers.

8. The method as claimed in claim 1, wherein the step (a) comprises the following substeps of:
   (a1) providing a substrate;
   (a2) forming a plurality of catalyst sections on the substrate;
   (a3) annealing the substrate with the catalyst sections at a temperature in a range from about 700° C. to about 900° C. in air for about 30 minutes to about 90 minutes;
   (a4) heating the substrate with the catalyst sections at a temperature in a range from about 500° C. to about 740° C. in a furnace with a protective gas therein; and
   (a5) supplying a carbon source gas into the furnace for about 5 minutes to about 30 minutes and growing the plurality of carbon nanotube arrays from the catalyst sections on the substrate.

9. The method as claimed in claim 8, wherein in step (a2), the catalyst sections are formed by electron beam evaporation through shadow masks.

10. The method as claimed in claim 8, wherein in step (a2), a plurality of intervals is defined between every two adjacent catalyst sections and the intervals correspond to the first interspaces.

11. The method as claimed in claim 1, wherein in step (b), a graphite paper is disposed in the container before the substrate is disposed into the container.

12. The method as claimed in claim 1, wherein the step (d) comprises the following substeps of:
   (d1) placing the container having the carbon nanotube arrays into a chamber, wherein the chamber is at about 20° C. to about 200° C. and filled with at least one inert gas;
   (d2) increasing the temperature of the chamber at a rate of about 5° C. per minute, until the temperature of the chamber is about 150° C. to about 200° C.;
   (d3) holding the temperature from about 0.2 hours to about 1.5 hours, and melting the low melting point metallic nanoparticles into a liquid state; and
   (d4) cooling the chamber to room temperature in an environment of inert gas, holding the room temperature for a while until the low melting point metallic nanoparticles in the liquid state are solidified into a solid state and combined with the carbon nanotube arrays to form the composite material.

* * * * *